(12) United States Patent
Liu

(10) Patent No.: US 9,793,507 B2
(45) Date of Patent: Oct. 17, 2017

(54) OLED DEVICE PACKAGING METHOD AND OLED DEVICE PACKAGED WITH SAME

(71) Applicant: Shenzhen China Star Optoelectronics Technology Co., Ltd., Shenzhen, Guangdong (CN)

(72) Inventor: Yawei Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/224,150

(22) Filed: Jul. 29, 2016

(65) Prior Publication Data

US 2016/0336539 A1 Nov. 17, 2016

Related U.S. Application Data

(63) Continuation of application No. 14/118,230, filed on Nov. 17, 2013.

(51) Int. Cl.
*H01L 51/56* (2006.01)
*H01L 51/52* (2006.01)

(52) U.S. Cl.
CPC .......... *H01L 51/5246* (2013.01); *H01L 51/56* (2013.01); *H01L 51/524* (2013.01); *H01L 2251/558* (2013.01)

(58) Field of Classification Search
CPC ... H01L 51/5246; H01L 51/524; H01L 51/56; H01L 2251/558
See application file for complete search history.

(56) References Cited

U.S. PATENT DOCUMENTS

| 5,804,908 | A | * | 9/1998 | Yano | .......... | H01J 5/52 310/357 |
| 2003/0062254 | A1 | * | 4/2003 | Choi | .......... | C23C 14/046 204/192.3 |
| 2009/0302760 | A1 | * | 12/2009 | Tchakarov | .......... | H01L 51/5203 313/512 |
| 2010/0225231 | A1 | * | 9/2010 | Cok | .......... | H01L 23/10 313/512 |
| 2012/0048453 | A1 | * | 3/2012 | Ito | .......... | C03C 27/06 156/182 |
| 2013/0223922 | A1 | * | 8/2013 | Koval | .......... | C03B 23/245 403/270 |

(Continued)

*Primary Examiner* — Caridad Everhart
(74) *Attorney, Agent, or Firm* — Andrew C. Cheng

(57) ABSTRACT

Provided is an OLED device packaging method, which includes: providing an OLED substrate that includes an OLED unit formed on surface thereof; attaching an insulation material to the surface of the OLED substrate to form a first frame having frame members located outside and circumferentially surround arranged the OLED unit; providing a packaging cover having a surface; attaching a low-temperature metal conductive adhesive tape directly on the surface of the packaging cover to form a second frame having frame members corresponding to and having a width smaller than the frame members of the first frame; laminating the packaging cover and the OLED substrate together in a vacuum environment with the frame members of first and second frames stacked on each other; and (6) melting the second frame securely bond the packaging cover and the OLED substrate together. Also provided is an OLED device formed with such a packaging method.

15 Claims, 3 Drawing Sheets

(56) References Cited

U.S. PATENT DOCUMENTS

| 2014/0078719 | A1* | 3/2014 | Jung | H05K 5/02 |
| | | | | 362/97.1 |
| 2014/0087099 | A1* | 3/2014 | Veerasamy | E06B 3/6775 |
| | | | | 428/34 |
| 2015/0114966 | A1* | 4/2015 | Koike | B65D 85/38 |
| | | | | 220/315 |

* cited by examiner

OLED DEVICE PACKAGING METHOD AND OLED DEVICE PACKAGED WITH SAME

CROSS REFERENCE TO RELATED APPLICATIONS

The application is a continuation of co-pending U.S. patent application Ser. No. 14/118,230 filed on Nov. 17, 2013.

BACKGROUND OF THE INVENTION

1. Field of the Invention

The present invention relates to the field of OLED (Organic Light Emitting Display) device packaging techniques, and in particular to an OLED device packaging method and an OLED packaged with the method.

2. The Related Arts

In the field of displaying technology, flat panel display devices gradually take the place of CRT (Cathode Ray Tube) display devices. Conventional flat panel display devices generally include liquid crystal displays (LCDs) and organic light emitting displays (OLEDs). Planar lighting technology is a novel light source and the development thereof has already gotten close to the stage of commercialized mass production. In the flat panel display and planar lighting technologies, bonding and welding between two flat glass panels is a technique of vital importance and the result of packaging thereof will directly affect the performance of the devices.

Ultraviolet (UV) curing is the technique that has been adopted earliest and possesses the following advantages: No solvent or a minor amount of solvent is used so that the environmental pollution caused by solvent can be reduced; energy consumption is small and curing at low temperatures is possible so as to be applicable to heat-sensitive materials; curing speed is high and efficient is also high so as to be applicable to a high speed manufacture line with the curing facility having a small floor area. However, the UV resins are organic materials and exhibit relatively large gaps between molecules after being cured so that moisture and oxygen may easily penetrate the medium to reach the interior enclosed area. Thus, they are suitable for applications where sensitivity to moisture and oxygen is not prominent, such as LCD.

Frit based packaging techniques are novel flat glass panel packaging techniques that are under development and there is generally no papers related therewith in China. It is often made by formulating glass granulates to form a solution having a predetermined viscosity for application to coat packaging glass, wherein the solvent is removed through heating for subsequent laminating with glass to be packaged. Laser is then applied to instantaneously heat and fuse the glass granulates to thereby bond the two flat panels of glass together. The frit technology is an inorganic packaging medium so that it displays excellent capability of resisting moisture and oxygen, making it particularly suitable for OLED techniques that are sensitive to moisture and oxygen.

Metal welding is a commonly used welding technique and welding technique for glass has already been long used. However, to apply metal welding between two flat panels of glass, due to the limitations that the welding temperature is not allowed to be excessively high (the temperature of a welded zone being not allowed to exceed 900° C.) and the thermal expansion coefficients of commonly used metals are different from glass (which may lead to stress), techniques of this area have not been popularized. It is thus an important issue to handle welding of glass substrate by developing a novel metal welding technique.

SUMMARY OF THE INVENTION

An object of the present invention is to provide an OLED device packaging method, which has a simple process, provides an excellent effect of packaging, effectively extends the life span of the OLED device, and requires a low cost.

Another object of the present invention is to provide an OLED device, which has an extended life span and a relatively low packaging expense.

To achieve the above objects, the present invention provides an OLED device packaging method, which comprises the following steps:

(1) providing an OLED substrate, wherein the OLED substrate comprises an OLED unit formed thereon;

(2) using insulation material to form a first frame on the OLED substrate, wherein the first frame is arranged around and outside the OLED unit;

(3) providing a packaging cover;

(4) using a low-temperature metal conductive adhesive tape to form a second frame on the packaging cover to correspond in position to the first frame, wherein the second frame has a frame member width that is smaller than a frame member width of the first frame;

(5) aligning and laminating the packaging cover that comprises the second frame formed thereon and the OLED substrate that comprises the first frame formed thereon in a vacuum environment; and (6) melting the second frame to have the packaging cover and the OLED substrate bonded together.

The insulation material comprises an inorganic insulation material.

The inorganic insulation material comprises silicon or silicon dioxide.

The packaging cover comprises a recess formed therein and the second frame is received in the recess. The second frame has frame members that have a thickness greater than a depth of the recess.

In step (6), laser is applied to melt the second frame so as to bond the packaging cover and the OLED substrate together through welding.

The low-temperature metal conductive adhesive tape is made of a metal material or a metal alloy, having a melting point less than or equal to 900° C.

The low-temperature metal conductive adhesive tape has a thickness of 5-150 micrometers; the low-temperature metal conductive adhesive tape has a width of 200-2000 micrometers; and the low-temperature metal conductive adhesive tape has an expansion coefficient of $3.0\text{-}6.0 \times 10^{-6}$ m/K.

The low-temperature metal conductive adhesive tape comprises a tin foil conductive adhesive tape or an aluminum foil conductive adhesive tape.

The present invention also provides an OLED device packaging method, which comprises the following steps:

(1) providing an OLED substrate, wherein the OLED substrate comprises an OLED unit formed thereon;

(2) using insulation material to form a first frame on the OLED substrate, wherein the first frame is arranged around and outside the OLED unit;

(3) providing a packaging cover;

(4) using a low-temperature metal conductive adhesive tape to form a second frame on the packaging cover to correspond in position to the first frame, wherein the second frame has a frame member width that is smaller than a frame member width of the first frame;

(5) aligning and laminating the packaging cover that comprises the second frame formed thereon and the OLED substrate that comprises the first frame formed thereon in a vacuum environment; and (6) melting the second frame to have the packaging cover and the OLED substrate bonded together; and wherein the insulation material comprises an inorganic insulation material;

wherein the inorganic insulation material comprises silicon or silicon dioxide; and wherein the packaging cover comprises a recess formed therein and the second frame is received in the recess, the second frame having frame members that have a thickness greater than a depth of the recess.

In step (6), laser is applied to melt the second frame so as to bond the packaging cover and the OLED substrate together through welding.

The low-temperature metal conductive adhesive tape is made of a metal material or a metal alloy, having a melting point less than or equal to 900° C.

The low-temperature metal conductive adhesive tape has a thickness of 5-150 micrometers; the low-temperature metal conductive adhesive tape has a width of 200-2000 micrometers; and the low-temperature metal conductive adhesive tape has an expansion coefficient of $3.0\text{-}6.0\times10^{-6}$ m/K.

The low-temperature metal conductive adhesive tape comprises a tin foil conductive adhesive tape or an aluminum foil conductive adhesive tape.

The present invention further provides an OLED device, which comprises: an OLED substrate, an OLED unit formed on the OLED substrate, a first frame formed on the OLED substrate and arranged around and outside the OLED unit, a packaging cover arranged opposite to the OLED substrate, and a second frame formed on the packaging cover in such a way that the first frame and the second frame correspond in position to each other and the second frame has a frame member width that is smaller than a frame member width of the first frame. The first frame is formed of an inorganic insulation material. The second frame is formed of a low-temperature metal conductive adhesive tape.

The packaging cover comprises a recess formed therein and the second frame is received in the recess. The second frame has frame members that have a thickness greater than a depth of the recess.

The efficacy of the present invention is that the present invention provides an OLED device packaging method and an OLED device packaged with the method, wherein a low-temperature metal conductive adhesive tape is used to weld and bond an OLED substrate and a packaging cover together to effectively prevent moisture and oxygen from entering the interior of the OLED device so as to extend the service life of the OLED device. Further, the low-temperature metal conductive adhesive tape is of a relatively low price, making it possible to effectively reduce the packaging cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
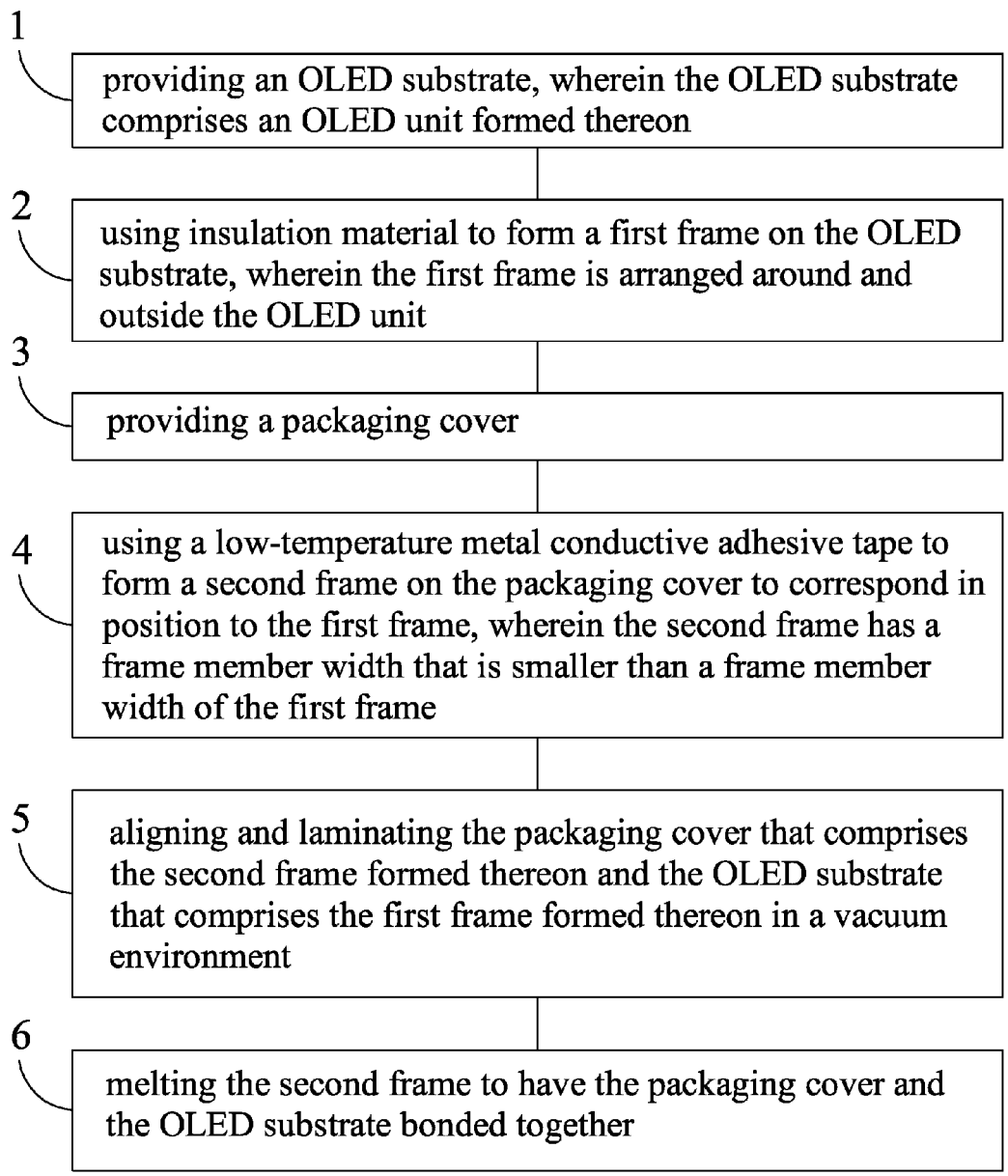
FIG. 1 is a flow chart illustrating a method for packaging an OLED device according to the present invention.
Figure 2:
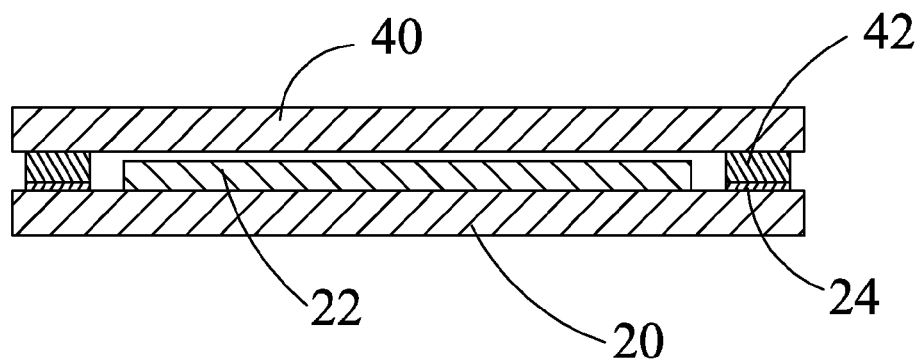
FIG. 2 is a schematic view showing a first embodiment of an OLED device that is packaged with the method for packaging an OLED device according to the present invention.

Referring to FIGS. 1 and 2, an OLED device packaging method comprises the following steps:

Step 1: providing an OLED substrate 20, wherein the OLED substrate 20 comprises an OLED unit 22 formed thereon.

The OLED substrate 20 is a transparent substrate, preferably a glass substrate. The OLED unit 22 generally comprises: an anode, an organic layer formed on the anode, and a cathode formed on the organic layer. It is noted that the organic layer generally comprises a hole transport layer (HTL) formed on the anode, an emitting material layer (EML) formed on the hole transport layer, and an electron transport layer (ETL) formed on the emitting material layer, each being formed by means of vapor deposition.

Step 2: using insulation material to form a first frame 24 on the OLED substrate 20, wherein the first frame 24 is arranged around and outside the OLED unit 22.

The insulation material is preferably an inorganic insulation material. In the instant embodiment, the inorganic insulation material is silicon (Si) or silicon dioxide ($SiO_2$).

Step 3: providing a packaging cover 40.

The packaging cover 40 is a transparent cover, preferably a glass cover. The packaging cover 40 and the OLED substrate 20 are of the same size and shape.

Step 4: using a low-temperature metal conductive adhesive tape to form a second frame 42 on the packaging cover 40 to correspond in position to the first frame 24, wherein the second frame 42 has a frame member width that is smaller than a frame member width of the first frame 24.

The frame member width of the second frame 42 is made smaller than the frame member width of the first frame 24 in order to prevent, in a subsequent welding and bonding process, the low-temperature metal conductive adhesive tape from contacting the OLED substrate 20 so as to result in shorting.

The low-temperature metal conductive adhesive tape is made of a metallic material or a metal alloy, which has a melting point less than or equal to 900° C. The low-temperature metal conductive adhesive tape has a thickness of 5-150 micrometers. The low-temperature metal conductive adhesive tape has a width of 200-2000 micrometers. The low-temperature metal conductive adhesive tape has an expansion coefficient of $3.0\text{-}6.0\times10^{-6}$ m/K. The low-temperature metal conductive adhesive tape can be tin foil conductive adhesive tape or an aluminum foil conductive adhesive tape.

Further, the low-temperature metal conductive adhesive tape is a pre-formed strip-like thin metal sheet so as to theoretically reach flatness of a top surface. The flatness thereof is surely superior to the upper surface obtained through resin application and baking/drying in the frit technology. The flatness is of vital importance to the frit technology, where the better the flatness is, the fuller contact there will be between the OLED substrate 20 and the packaging cover 40s so that after laser welding, the OLED substrate 20 and the packaging cover 40 are flat welded and bonded together to avoid the occurrence of welding gap and preventing external moisture and oxygen from entering the interior of the packaged body thereby effectively enhancing the effect of packaging.

Step 5: aligning and laminating the packaging cover 40 that comprises the second frame 42 formed thereon and the OLED substrate 20 that comprises the first frame 24 formed thereon in a vacuum environment.

Step 6: melting the second frame 42 to have the packaging cover 40 and the OLED substrate 20 bonded together.

Specifically, a carbon dioxide ($CO_2$) laser device or other suitable laser device, having a wavelength in the range of 800 nm-1200 nm, is used. The focus length and focal spot size and laser energy intensity are adjusted to have the focal spot fall on the low-temperature metal conductive adhesive tape. The focal spot of the laser device is then moved along the low-temperature metal conductive adhesive tape to have the packaging cover 40 and the OLED substrate 20 bonded together through welding.

Figure 3:
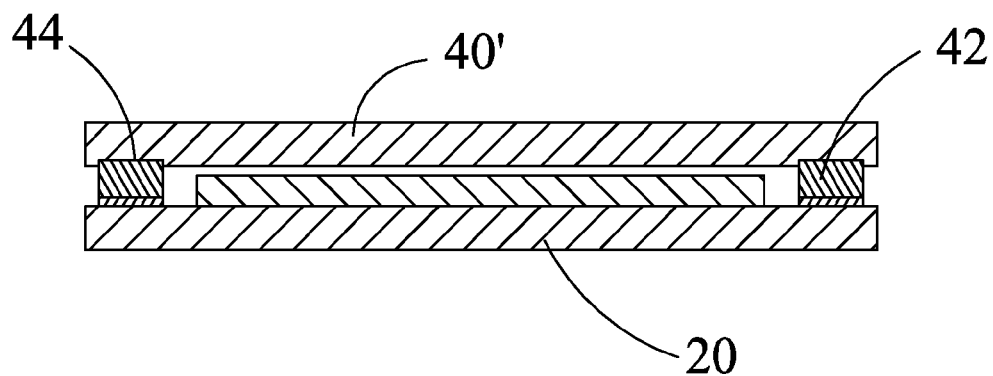
FIG. 3 is a schematic view showing a second embodiment of an OLED device that is packaged with the method for packaging an OLED device according to the present invention.
Figure 4:
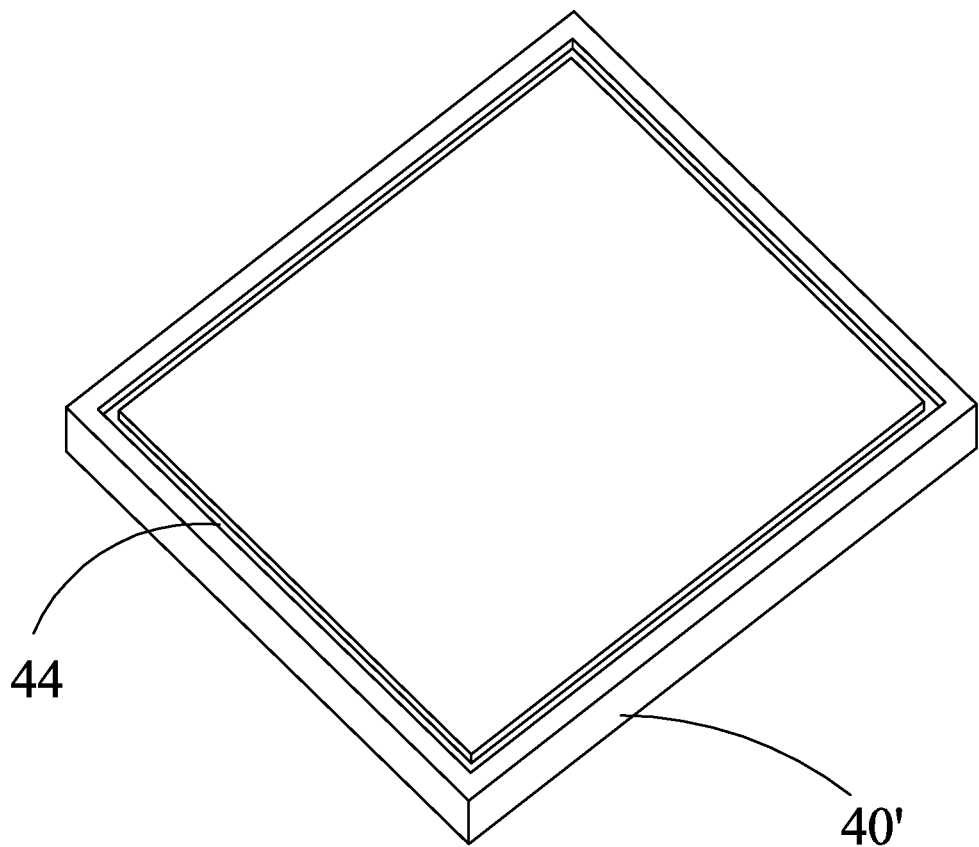
FIG. 4 is a perspective view showing a packaging cover of FIG. 3.

Referring to FIG. 3, which is a schematic view showing a second embodiment of an OLED device packaged with the OLED device packaging method according to the present invention, in the instant embodiment, the packaging cover 40' comprises a recess 44 (as shown in FIG. 4) formed therein and the second frame 42 is received in the recess 44. The second frame 42 have frame members that have a thickness that is greater than depth of the recess 44 in order to reduce the distance between the OLED substrate 20 and the packaging cover 40' and thus further reduce the moisture/oxygen contents in the packaged space thereby extending the service life of the OLED device.

Referring to FIG. 2, the present invention also provides an OLED device, which comprises: an OLED substrate 20, an OLED unit 22 formed on the OLED substrate 20, a first frame 24 formed on the OLED substrate 20 and arranged around and outside the OLED unit 22, a packaging cover 40 arranged opposite to the OLED substrate 20, and a second frame 42 formed on the packaging cover 40 in such a way that the first frame 24 and the second frame 42 correspond in position to each other and the second frame 42 has a frame member width that is smaller than a frame member width of the first frame 24. The first frame 24 is formed of an inorganic insulation material and the second frame 42 is formed of a low-temperature metal conductive adhesive tape.

The frame member width of the second frame 42 is made smaller than the frame member width of the first frame 24 in order to prevent, in a subsequent welding and bonding process, the low-temperature metal conductive adhesive tape from contacting the OLED substrate 20 so as to result in shorting.

The low-temperature metal conductive adhesive tape is made of a metallic material or a metal alloy, which has a melting point less than or equal to 900° C. The low-temperature metal conductive adhesive tape has a thickness of 5-150 micrometers. The low-temperature metal conductive adhesive tape has a width of 200-2000 micrometers. The low-temperature metal conductive adhesive tape has an expansion coefficient of $3.0$-$6.0 \times 10^{-6}$ m/K. The low-temperature metal conductive adhesive tape can be tin foil conductive adhesive tape or an aluminum foil conductive adhesive tape.

Further, the low-temperature metal conductive adhesive tape is a pre-formed strip-like thin metal sheet so as to theoretically reach flatness of a top surface. The flatness thereof is surely superior to the upper surface obtained through resin application and baking/drying in the frit technology. The flatness is of vital importance to the frit technology, where the better the flatness is, the fuller contact there will be between the OLED substrate 20 and the packaging cover 40s so that after laser welding, the OLED substrate 20 and the packaging cover 40 are flat welded and bonded together to avoid the occurrence of welding gap and preventing external moisture and oxygen from entering the interior of the packaged body thereby effectively enhancing the effect of packaging.

Referring to FIG. 3, which is a schematic view showing a second embodiment of an OLED device packaged with the OLED device packaging method according to the present invention, in the instant embodiment, the packaging cover 40' comprises a recess 44 (as shown in FIG. 4) formed therein and the second frame 42 is received in the recess 44. The second frame 42 have frame members that have a thickness that is greater than depth of the recess 44 in order to reduce the distance between the OLED substrate 20 and the packaging cover 40' and thus further reduce the moisture/oxygen contents in the packaged space thereby extending the service life of the OLED device.

In summary, the present invention provides an OLED device packaging method and an OLED device packaged with the method, wherein a low-temperature metal conductive adhesive tape is used to weld and bond an OLED substrate and a packaging cover together to effectively prevent moisture and oxygen from entering the interior of the OLED device so as to extend the service life of the OLED device. Further, the low-temperature metal conductive adhesive tape is of a relatively low price, making it possible to effectively reduce the packaging cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light emitting display (OLED) device packaging method, comprising the following steps:
    (1) providing an OLED substrate, wherein the OLED substrate comprises a first surface on which an OLED unit is formed;
    (2) attaching an insulation material on the first surface of the OLED substrate so as to form a first frame on the first surface of the OLED substrate, wherein the first frame comprises frame members that are directly mounted to the first surface of the OLED substrate and located outside the OLED unit and are connected to each other in an end-to-end manner to form a loop that circumferentially surrounds the OLED unit;
    (3) providing a packaging cover having a second surface facing and spaced from the first surface of the OLED substrate;

(4) directly attaching a low-temperature metal conductive adhesive tape to the inner second surface of the packaging cover so as to form a second frame on the second surface of the packaging cover, wherein the second frame comprises frame members respectively corresponding in position to the frame members of the first frame and having a width that is smaller than a width of the frame members of the first frame, the frame member of the second frame being directly mounted to the second surface of the packaging cover and connected to each other in an end-to-end manner to form a loop corresponding in shape and position to the loop of the first frame;

(5) laminating the packaging cover and the OLED substrate together in a vacuum environment with the first surface of the OLED substrate and the second surface of the packaging cover facing and spaced from each other such that the frame members of the second frame and the frame members are in alignment with and stacked on each other respectively and are in direct engagement with each other; and (6) melting the second frame to have the second frame directly bonded to the first frame to form a bonded stacked arrangement of the first frame and the second frame between the second surface of the packaging cover and the first surface of the OLED substrate so as to bond the packaging cover and the OLED substrate together;

wherein the low-temperature metal conductive adhesive tape is a pre-formed strip-like thin metal sheet having a flat top surface.

2. The OLED device packaging method as claimed in claim 1, wherein the packaging cover comprises a recess formed in the second surface thereof in the form of a loop that corresponds to the loop of the second frame and the second frame is partly received in the recess to be directly attached to the second surface of the packaging cover, such that a portion of the second frame is located above the second surface of the packaging cover to define a top surface of the second frame that is spaced from the second surface of the packaging cover by a distance that is greater than a distance between the top surface of the second frame and a bottom of the recess.

3. The OLED device packaging method as claimed in claim 1, wherein in step (6), melting the second frame is achieved by applying a laser beam thereto so as to have the second frame so melted bond the packaging cover and the OLED substrate together through welding.

4. The OLED device packaging method as claimed in claim 1, wherein the low-temperature metal conductive adhesive tape is made of a metal material or a metal alloy, having a melting point less than or equal to 900° C.

5. The OLED device packaging method as claimed in claim 1, wherein the low-temperature metal conductive adhesive tape has a thickness of 5-150 micrometers, a width of 200-2000 micrometers, and an expansion coefficient of $3.0\text{-}6.0\times10^{-6}$ m/K.

6. The OLED device packaging method as claimed in claim 1, wherein the low-temperature metal conductive adhesive tape comprises a tin foil conductive adhesive tape or an aluminum foil conductive adhesive tape.

7. The OLED device packaging method as claimed in claim 1, wherein the insulation material comprises an inorganic insulation material.

8. The OLED device packaging method as claimed in claim 7, wherein the inorganic insulation material comprises silicon or silicon dioxide.

9. An organic light emitting display (OLED) device, comprising:
an OLED substrate, which has a first surface that comprises an OLED unit formed thereon;
a first frame, which is formed of an insulation material directly attached to the first surface of the OLED substrate and comprises frame members that are directly mounted to the first surface of the OLED substrate and located outside the OLED unit and are connected to each other in an end-to-end manner to form a loop that circumferentially surrounds the OLED unit;
a packaging cover, which is opposite to the OLED substrate and has second surface facing and spaced from the first surface of the OLED substrate; and
a second frame, which is formed of a low-temperature metal conductive adhesive tape directly attached to the second surface of the packaging cover and comprises frame members respectively-corresponding, in position, to the frame members of the frame members of the first frame, the frame member of the second frame being directly mounted to the second surface of the packaging cover and connected to each other in an end-to-end manner to form a loop corresponding in shape and position to the loop of the first frame;
wherein the frame members of the second frame have a width that is smaller than a width of the frame members of the first frame and the second frame is meltable to have the second frame directly bonded to the first frame to form a bonded stacked arrangement of the first frame and the second frame between the inner surfaces of the packaging cover and the OLED substrate so as to securely bond the OLED substrate and the packaging cover to each other; and
wherein the low-temperature metal conductive adhesive tape is a pre-formed strip-like thin metal sheet having a flat top surface.

10. The OLED device as claimed in claim 9, wherein the packaging cover comprises a recess formed in the second surface thereof in the form of a loop that corresponds to the loop of the second frame and the second frame is partly received in the recess to be directly attached to the second surface of the packaging cover such that a portion of the second frame is located above the second surface of the packaging cover to define a top surface of the second frame that is spaced from the second surface of the packaging cover by a distance that is greater than a distance between the top surface of the second frame and a bottom of the recess.

11. The OLED device as claimed in claim 9, wherein the low-temperature metal conductive adhesive tape is made of a metal material or a metal alloy, having a melting point less than or equal to 900° C. so as to be meltable through application of a laser beam thereto.

12. The OLED device as claimed in claim 9, wherein the low-temperature metal conductive adhesive tape has a thickness of 5-150 micrometers, a width of 200-2000 micrometers, and an expansion coefficient of $3.0\text{-}6.0\times10^{-6}$ m/K.

13. The OLED device as claimed in claim 9, wherein the low-temperature metal conductive adhesive tape comprises a tin foil conductive adhesive tape or an aluminum foil conductive adhesive tape.

14. The OLED device as claimed in claim 9, wherein the insulation material comprises an inorganic insulation material.

15. The OLED device as claimed in claim 14, wherein the inorganic insulation material comprises silicon or silicon dioxide.

\* \* \* \* \*